US009755089B2

United States Patent
Cheong et al.

(10) Patent No.: US 9,755,089 B2
(45) Date of Patent: Sep. 5, 2017

(54) SOLAR CELL AND METHOD FOR MANUFACTURING THE SAME

(71) Applicant: LG ELECTRONICS INC., Seoul (KR)

(72) Inventors: Juhwa Cheong, Seoul (KR); Sangwook Park, Seoul (KR); Junyong Ahn, Seoul (KR); Manhyo Ha, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/478,841

(22) Filed: Sep. 5, 2014

(65) Prior Publication Data

US 2015/0179837 A1 Jun. 25, 2015

(30) Foreign Application Priority Data

Dec. 24, 2013 (KR) .................... 10-2013-0162763

(51) Int. Cl.
*H01L 21/00* (2006.01)
*H01L 31/0224* (2006.01)
(Continued)

(52) U.S. Cl.
CPC .. *H01L 31/022433* (2013.01); *H01L 31/0201* (2013.01); *H01L 31/02167* (2013.01); *H01L 31/068* (2013.01); *Y02E 10/547* (2013.01)

(58) Field of Classification Search
CPC ............ H01L 31/18; H01L 31/022433; H01L 31/068; H01L 31/0201; H01L 31/02167; Y02E 10/547
(Continued)

(56) References Cited

U.S. PATENT DOCUMENTS 8,541,266 B2 * 9/2013 Yamazaki ........... H01L 29/4908
257/43
8,859,320 B2 * 10/2014 Mitta et al. ................ 438/72
(Continued)

FOREIGN PATENT DOCUMENTS

CN 102157570 A * 8/2011
CN WO 2014019340 A1 * 2/2014 ....... H01L 31/02167
(Continued)

OTHER PUBLICATIONS

Hoex et al., "On the c-Si Surface Passivation Mechanism by the Negative-charge-dielectric $Al_2O_3$," Journal of Applied Physics, vol. 104, Published Online Dec. 1, 2008, pp. 113703-1-113703-7, XP-12116651A.
(Continued)

*Primary Examiner* — Phat X Cao
*Assistant Examiner* — Mohammad M Hoque
(74) *Attorney, Agent, or Firm* — Birch, Stewart, Kolasch & Birch, LLP (57) ABSTRACT

A solar cell is discussed. The solar cell includes a semiconductor substrate of a first conductive type, an emitter region of a second conductive type opposite the first conductive type, which is positioned at a front surface of the semiconductor substrate, a front passivation part positioned on a front surface of the emitter region, a front electrode part which passes through the front passivation part and is electrically connected to the emitter region, a back passivation part positioned on a back surface of the semiconductor substrate, and a back electrode part which passes through the back passivation part and is electrically connected to the semiconductor substrate. The front passivation part and the back passivation part each include a silicon oxide layer. One of the front passivation part and the back passivation part includes an aluminum oxide layer.

15 Claims, 5 Drawing Sheets

(51) Int. Cl.
*H01L 31/0216* (2014.01)
*H01L 31/02* (2006.01)
*H01L 31/068* (2012.01)

(58) Field of Classification Search
USPC .......................................................... 438/57
See application file for complete search history.

(56) References Cited

U.S. PATENT DOCUMENTS

| | | | |
|---|---|---|---|
| 2009/0056798 A1* | 3/2009 | Merchant ................ | H01B 1/16 136/256 |
| 2009/0165855 A1* | 7/2009 | Sun .................. | H01L 31/02167 136/261 |
| 2010/0330812 A1* | 12/2010 | Akiyama .......... | H01L 21/02178 438/761 |
| 2011/0097840 A1* | 4/2011 | Ramappa .......... | H01L 31/02168 438/87 |
| 2011/0139250 A1* | 6/2011 | Du .................... | H01L 31/02167 136/261 |
| 2011/0140226 A1* | 6/2011 | Jin .................... | H01L 31/02168 257/460 |
| 2011/0265870 A1* | 11/2011 | Park .................. | H01L 31/02167 136/256 |
| 2011/0284068 A1 | 11/2011 | Moslehi et al. | |
| 2012/0048372 A1* | 3/2012 | Kim .................. | H01L 31/02167 136/258 |
| 2012/0058634 A1* | 3/2012 | Yeh .................... | H01L 21/31111 438/591 |
| 2012/0091566 A1 | 4/2012 | Engelhart et al. | |
| 2012/0174960 A1* | 7/2012 | Hashigami ........ | H01L 31/02167 136/244 |
| 2012/0305060 A1* | 12/2012 | Fu .................... | H01L 31/0747 136/255 |
| 2012/0322199 A1* | 12/2012 | Graff .................. | H01L 31/0682 438/97 |
| 2013/0146135 A1* | 6/2013 | Lee .......................... | H01B 1/22 136/256 |
| 2013/0160839 A1 | 6/2013 | Cheong et al. | |
| 2013/0220396 A1* | 8/2013 | Janssen ............ | H01L 31/02161 136/244 |
| 2013/0247965 A1* | 9/2013 | Swanson .......... | H01L 31/02167 136/252 |
| 2013/0255777 A1 | 10/2013 | Lee et al. | |
| 2013/0327381 A1 | 12/2013 | Chung et al. | |
| 2013/0330936 A1* | 12/2013 | Lachaud ............... | C23C 16/402 438/787 |
| 2013/0337604 A1* | 12/2013 | Ozawa .................... | H01L 31/18 438/98 |
| 2014/0014175 A1* | 1/2014 | Ito ..................... | H01L 31/02167 136/256 |
| 2014/0060627 A1* | 3/2014 | Haensch ........... | H01L 31/02167 136/255 |
| 2014/0083502 A1* | 3/2014 | Wu ................... | H01L 31/02167 136/258 |
| 2014/0199806 A1* | 7/2014 | Lennon ............... | H01L 21/2254 438/98 |
| 2014/0299186 A1* | 10/2014 | Cesar .................. | H01L 31/0682 136/256 |
| 2014/0311563 A1* | 10/2014 | Jaffrennou ........ | H01L 31/02168 136/256 |
| 2014/0361407 A1* | 12/2014 | Davis .................. | H01L 21/2255 257/607 |
| 2015/0027524 A1* | 1/2015 | Seyedmohammadi | H01L 31/02242 136/256 |
| 2015/0166582 A1* | 6/2015 | Adachi ............. | H01L 31/02168 136/256 |
| 2015/0249164 A1* | 9/2015 | Karkkainen ........ | H01L 31/1868 136/256 |
| 2015/0255638 A1* | 9/2015 | Karkkainen ........ | H01L 31/0547 136/256 |
| 2015/0280020 A1* | 10/2015 | Karkkainen ...... | H01L 31/02168 438/65 |
| 2015/0295196 A1* | 10/2015 | Karkkainen ........ | H01L 31/1868 136/256 |

FOREIGN PATENT DOCUMENTS

| | | |
|---|---|---|
| JP | 2012-23227 A | 2/2012 |
| KR | 10-2012-0083400 A | 7/2012 |
| KR | 10-2013-0056364 A | 5/2013 |
| KR | 10-2013-0124783 A | 11/2013 |
| WO | WO 2013/109466 A1 | 7/2013 |

OTHER PUBLICATIONS

Kessels et al., "Electric Field Induced Surface Passivation of Si by Atomic Layer Deposited Al$_2$O$_3$ Studied by Optical Second-harmonic Generation," Photovoltaic Specialists Conference (PVSC), 34th IEEE, Piscataway, New Jersey, USA, Jun. 7, 2009, pp. 000427-000431, XP-31626849A.

Terlinden et al., "Role of Field-effect on c-Si Surface Passivation by Ultrathin (2-20 nm) Atomic Layer Deposited Al$_2$O$_3$," Applied Physics Letters, vol. 96, published online Mar. 15, 2010, pp. 112101-1-112101-3, XP-12130428A.

* cited by examiner

SOLAR CELL AND METHOD FOR MANUFACTURING THE SAME

This application claims priority to and the benefit of Korean Patent Application No. 10-2013-0162763 filed in the Korean Intellectual Property Office on Dec. 24, 2013, the entire contents of which are incorporated herein by reference.

BACKGROUND OF THE INVENTION

Field of the Invention

Embodiments of the invention relate to a solar cell and a method for manufacturing the same.

Description of the Related Art

Solar power generation to convert light energy into electric energy using a photoelectric conversion effect has been widely used as a method for obtaining eco-friendly energy. A solar power generation system using a plurality of solar cell modules has been installed in places, such as houses, due to an improvement in a photoelectric conversion efficiency of solar cells.

A solar cell generally includes a substrate and an emitter region forming a p-n junction along with the substrate. The solar cell generates an electric current using light incident through at least one surface of the substrate.

When light is incident on the solar cell, carriers, i.e., electrons and holes are produced in semiconductor parts of the solar cell. The electrons move to an n-type semiconductor part of the solar cell, and the holes move to a p-type semiconductor part of the solar cell.

The electrons moving to the n-type semiconductor part and the holes moving to the p-type semiconductor part are collected by different electrodes connected to the n-type semiconductor part and the p-type semiconductor part.

SUMMARY OF THE INVENTION

Embodiments of the invention provide a solar cell with high efficiency.

Embodiments of the invention also provide a method for manufacturing a solar cell with high efficiency.

In one aspect, there is a solar cell including a semiconductor substrate having a first conductive type, an emitter region positioned at a front surface of the semiconductor substrate, the emitter region having a second conductive type opposite the first conductive type, a front passivation part positioned on a front surface of the emitter region, the front passivation part including a plurality of layers, a front electrode part which passes through the front passivation part and is electrically connected to the emitter region, a back passivation part positioned on a back surface of the semiconductor substrate, the back passivation part including a plurality of layers, and a back electrode part which passes through the back passivation part and is electrically connected to the semiconductor substrate, wherein the front passivation part and the back passivation part each include a silicon oxide (SiOx) layer having a thickness of about 1 nm to 3 nm, wherein one of the front passivation part and the back passivation part includes an aluminum oxide (AlOx) layer, and the other of the front passivation part and the back passivation part does not include the aluminum oxide layer.

For example, when the first conductive type of the semiconductor substrate is an n-type, the aluminum oxide layer is included in the front passivation part and is not included in the back passivation part.

In this instance, the front passivation part may further include a hydrogenated silicon nitride (SiNx:H) layer positioned on a front surface of the aluminum oxide layer, and the back passivation part may further include a hydrogenated silicon nitride layer positioned on a back surface of the silicon oxide layer.

Further, when the first conductive type of the semiconductor substrate is a p-type, the aluminum oxide layer is included in the back passivation part and is not included in the front passivation part.

In this instance, the back passivation part may further include a hydrogenated silicon nitride layer positioned on a back surface of the aluminum oxide layer, and the front passivation part may further include a hydrogenated silicon nitride layer positioned on a front surface of the silicon oxide layer.

The solar cell may further include a back surface field region which is positioned at the back surface of the semiconductor substrate and is more heavily doped than the semiconductor substrate with impurities of the first conductive type.

Each of the front electrode part and the back electrode part may include a plurality of finger electrodes extending along a first direction and a plurality of bus bar electrodes extending along a second direction crossing the first direction. The finger electrodes and the bus bar electrodes may be arranged in a grid pattern.

In this instance, the back surface field region may be locally positioned at the back surface of the semiconductor substrate, may overlap the back electrode part having the grid pattern on a projected plane, and may physically and directly contact the back electrode part.

In another aspect, there is a method for manufacturing a solar cell including forming an emitter region of a second conductive type opposite a first conductive type at a front surface of a semiconductor substrate of the first conductive type and forming a back surface field region, which is more heavily doped than the semiconductor substrate with impurities of the first conductive type, at a back surface of the semiconductor substrate, forming a front passivation part on the front surface of the semiconductor substrate and forming a back passivation part on the back surface of the semiconductor substrate, and forming a front electrode part, which passes through the front passivation part and is electrically connected to the emitter region, on the front surface of the semiconductor substrate and forming a back electrode part, which passes through the back passivation part and is electrically connected to the semiconductor substrate, on the back surface of the semiconductor substrate.

The forming of the front passivation part and the back passivation part includes forming an aluminum oxide (AlOx) layer on each of the front surface and the back surface of the semiconductor substrate, annealing the aluminum oxide layers on the front surface and the back surface of the semiconductor substrate at a temperature of about 450° C. to 700° C. to form a silicon oxide (SiOx) layer having a thickness of about 1 nm to 3 nm between the aluminum oxide layer and the front surface of the semiconductor substrate and between the aluminum oxide layer and the back surface of the semiconductor substrate, and removing one of the aluminum oxide layer on the front surface of the semiconductor substrate and the aluminum oxide layer on the back surface of the semiconductor substrate.

For example, when the first conductive type of the semiconductor substrate is an n-type, the aluminum oxide layer on the back surface of the semiconductor substrate may be removed.

In this instance, the forming of the front passivation part and the back passivation part may further include forming a hydrogenated silicon nitride (SiNx:H) layer on a front surface of the aluminum oxide layer formed on the front surface of the semiconductor substrate and forming a hydrogenated silicon nitride layer on a back surface of the silicon oxide layer formed on the back surface of the semiconductor substrate.

Further, when the first conductive type of the semiconductor substrate is a p-type, the aluminum oxide layer on the front surface of the semiconductor substrate may be removed.

In this instance, the forming of the front passivation part and the back passivation part may further include forming a hydrogenated silicon nitride layer on a front surface of the silicon oxide layer formed on the front surface of the semiconductor substrate and forming a hydrogenated silicon nitride layer on a back surface of the aluminum oxide layer formed on the back surface of the semiconductor substrate.

In general, in a solar cell including a p-type semiconductor substrate, a front passivation part positioned on a front surface of the p-type semiconductor substrate includes a silicon oxide layer. Further, in a solar cell including an n-type semiconductor substrate, a back passivation part positioned on a back surface of the n-type semiconductor substrate includes a silicon oxide layer.

In a related art, because a high temperature process performed at a high temperature equal to or higher than about 900° C. is used to form the silicon oxide layer, a natural oxide layer has been already grown to a thickness of about 1 nm before the semiconductor substrate is loaded onto a furnace. Afterwards, the instant that the semiconductor substrate is loaded onto the furnace, a thermal oxide layer is grown to a thickness of several nanometers.

Accordingly, a thickness of a passivation part including the thermal oxide layer formed through the high temperature process exceeds 3 nm. Hence, an interface trap density of the passivation part increases, and chemical passivation characteristic of the passivation part is degraded.

Further, the high temperature process for growing the thermal oxide layer is additionally performed after the emitter region is formed. Therefore, it is impossible to manufacture a shallow emitter region in the solar cell including the thermal oxide layer. Hence, a collection efficiency of carriers is reduced.

Further, when the high temperature process for growing the thermal oxide layer is performed, iron (Fe) is activated in a bulk of the semiconductor substrate and serves as a defect. Therefore, bulk lifetime of the semiconductor substrate is reduced.

To solve the above-described problem, a method for growing the thermal oxide layer at a low temperature has been recently studied. However, the passivation characteristic of the thermal oxide layer grown at the low temperature is worse than the passivation characteristic of the thermal oxide layer grown at the high temperature.

However, in the solar cell according to the embodiment of the invention, the silicon oxide layer having the passivation characteristic similar to the thermal oxide layer grown at the high temperature may be formed to a thickness equal to or less than 3 nm, preferably, a thickness of 1 nm to 3 nm. Therefore, the low interface trap density may result in an increase in chemical passivation characteristic, the shallow emitter region may be manufactured, and a reduction in the bulk lifetime of the semiconductor substrate may be prevented.

Furthermore, in the solar cell including the p-type semiconductor substrate, the passivation characteristic is improved due to a field effect resulting from fixed charges of the silicon oxide layer included in the front passivation part. In the solar cell including the n-type semiconductor substrate, the passivation characteristic is improved due to a field effect resulting from fixed charges of the aluminum oxide layer included in the front passivation part.

Accordingly, the front passivation part reduces a recombination velocity of carries at the surface of the semiconductor substrate, thereby improving the efficiency and the long-term reliability of the solar cell.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention examples of which are illustrated in the accompanying drawings. Since the invention may be modified in various ways and may have various forms, specific embodiments are illustrated in the drawings and are described in detail in the specification. However, it should be understood that the invention are not limited to on the specific disclosed embodiments, but include all modifications, equivalents and substitutes included within the spirit and technical scope of the invention.

The terms 'first', 'second', etc., may be used to describe various components, but the components are not limited by such terms. The terms are used only for the purpose of distinguishing one component from other components.

For example, a first component may be designated as a second component without departing from the scope of the invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component.

On the other hand, when an arbitrary component is described as "being directly connected to" or "being directly linked to" another component, this should be understood to mean that no component exists between them.

The terms used in this application are used to describe only specific embodiments or examples, and are not intended to limit the invention. A singular expression can include a plural expression as long as it does not have an apparently different meaning in context.

In this application, the terms "include" and "have" should be understood to be intended to designate that illustrated features, numbers, steps, operations, components, parts or combinations thereof that are present and not to preclude the existence of one or more different features, numbers, steps, operations, components, parts or combinations thereof, or the possibility of the addition thereof.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Unless otherwise specified, all of the terms which are used herein, including the technical or scientific terms, have the same meanings as those that are generally understood by a person having ordinary knowledge in the art to which the invention pertains.

The terms defined in a generally used dictionary must be understood to have meanings identical to those used in the context of a related art, and are not to be construed to have ideal or excessively formal meanings unless they are obviously specified in this application.

The following example embodiments of the invention are provided to those skilled in the art in order to describe the invention more completely. Accordingly, shapes and sizes of elements shown in the drawings may be exaggerated for clarity.

Example embodiments of the invention will be described with reference to FIGS. 1 to 5.

Figure 1:
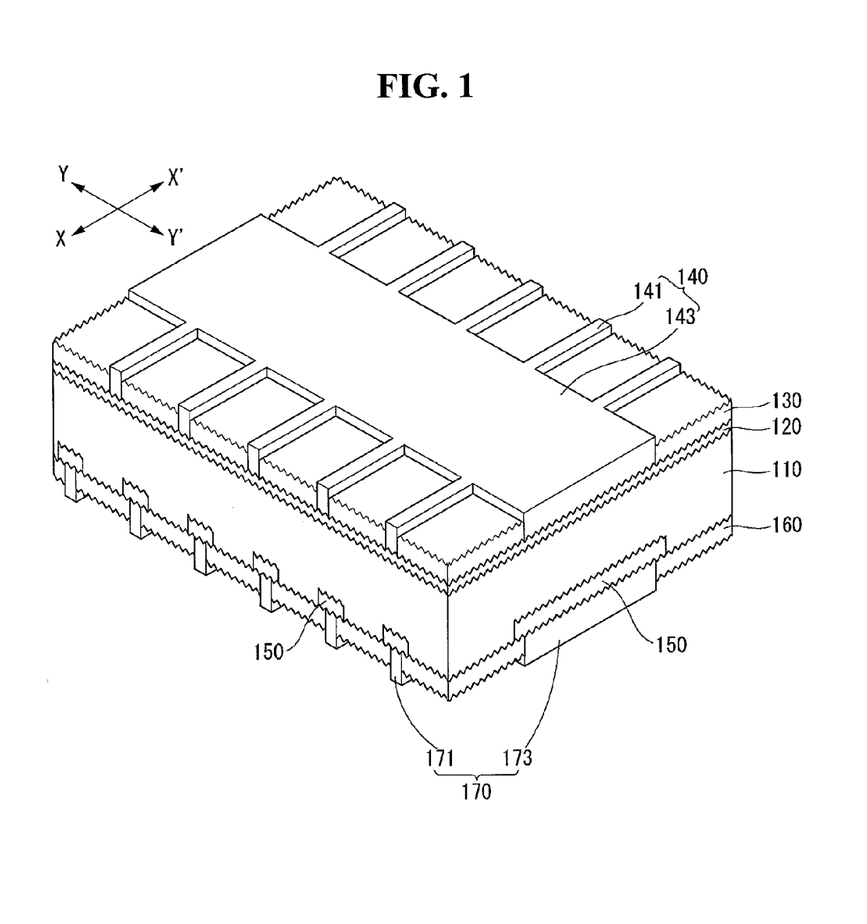
FIG. 1 is a perspective view of a main part of a solar cell according to a first embodiment of the invention.
Figure 2:
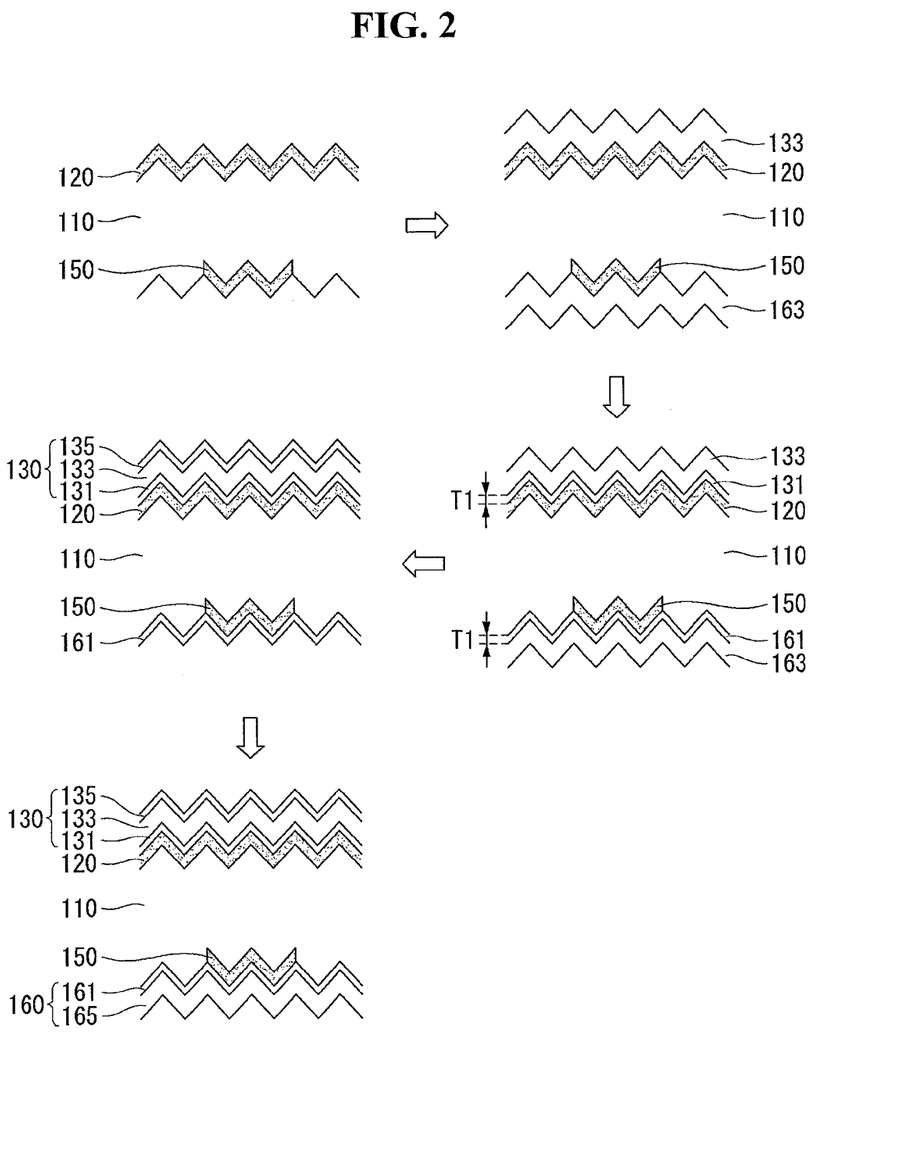
FIG. 2 is a process diagram showing a method for manufacturing the solar cell shown in FIG. 1.

FIG. 1 is a perspective view of a main part of a solar cell according to a first embodiment of the invention. FIG. 2 is a process diagram showing a method for manufacturing the solar cell shown in FIG. 1.

The solar cell according to the first embodiment of the invention includes a semiconductor substrate 110, an emitter region 120 positioned at one surface, for example, a front surface of the semiconductor substrate 110, a front passivation part 130 positioned on the emitter region 120, a front electrode part 140 which passes through the front passivation part 130 and is electrically and physically connected to the emitter region 120, a back surface field region 150 positioned at a back surface of the semiconductor substrate 110, a back passivation part 160 positioned on the back surface of the semiconductor substrate 110, and a back electrode part 170 which passes through the back passivation part 160 and is electrically and physically connected to the semiconductor substrate 110, particularly, the back surface field region 150.

In a bifacial solar cell having the above-described configuration, the front passivation part 130 and the back passivation part 160 each include a silicon oxide (SiOx) layer having a thickness T1 of about 1 nm to 3 nm. Further, one of the front passivation part 130 and the back passivation part 160 includes an aluminum oxide (AlOx) layer and the other does not include the AlOx layer depending on a conductive type of the semiconductor substrate 110.

Hereinafter, the embodiment of the invention is described on the assumption that the semiconductor substrate 110 is formed of a silicon wafer of a first conductive type, for example, an n-type, though not required. In this instance, silicon used in the semiconductor substrate 110 may be single crystal silicon, polycrystalline silicon, or amorphous silicon.

Because the semiconductor substrate 110 is of the n-type, the semiconductor substrate 110 contains impurities of a group V element such as phosphorus (P), arsenic (As), and antimony (Sb). It is preferable, but not required, that the semiconductor substrate 110 has resistivity of about 1 $\Omega \cdot cm^2$ to 10 $\Omega \cdot cm^2$.

The surface of the semiconductor substrate 110 may be textured to form a textured surface corresponding to an uneven surface or having uneven characteristics. More specifically, the front surface of the semiconductor substrate 110, at which the emitter region 120 is positioned, and the back surface of the semiconductor substrate 110 opposite the front surface may be formed as the textured surface.

The emitter region 120 positioned at the front surface of the semiconductor substrate 110 is an impurity region of a second conductive type (for example, p-type) opposite the first conductive type (for example, n-type) of the semiconductor substrate 110. Thus, the emitter region 120 forms a p-n junction along with the semiconductor substrate 110.

Carriers, i.e., electron-hole pairs produced by light incident on the semiconductor substrate 110 are separated into electrons and holes by a built-in potential difference resulting from the p-n junction between the semiconductor substrate 110 and the emitter region 120. Then, the separated electrons move to the n-type semiconductor, and the separated holes move to the p-type semiconductor.

Thus, when the semiconductor substrate 110 is of the n-type and the emitter region 120 is of the p-type, the separated electrons move to the semiconductor substrate 110 and the separated holes move to the emitter region 120.

When the emitter region 120 is of the p-type, the emitter region 120 may be formed by doping impurities of a group III element such as boron (B), gallium (Ga), and indium (In) on the semiconductor substrate 110.

The front passivation part 130 formed on a front surface of the emitter region 120 and the back passivation part 160 formed on the back surface of the semiconductor substrate 110 each include a plurality of layers.

More specifically, the front passivation part 130 includes a silicon oxide (SiOx) layer 131 having a thickness T1 of about 1 nm to 3 nm, an aluminum oxide ($AlO_X$) layer 133 positioned on the SiOx layer 131, and a hydrogenated silicon nitride (SiNx:H) layer 135 positioned on the $AlO_X$ layer 133.

Further, the back passivation part 160 includes a silicon oxide (SiOx) layer 161 having a thickness T1 of about 1 nm to 3 nm and a hydrogenated silicon nitride (SiNx:H) layer 165 positioned on a back surface of the SiOx layer 161.

The $AlO_X$ layer 133 is formed of a material having negative fixed charges. Hence, the $AlO_X$ layer 133 has excellent chemical passivation characteristics resulting from a low interface trap density and excellent field effect passivation characteristics resulting from the negative fixed charges. Further, the $AlO_X$ layer 133 is very excellent in the characteristics of stability, moisture transmission, and abrasion resistance.

Thus, the front passivation part 130 reduces a recombination velocity of carries at the surface of the semiconductor substrate 110, thereby improving the efficiency and the long-term reliability of the solar cell.

Because the $AlO_X$ layer 133 serves as a front surface field region, n-type impurities used to form the front surface field region do not need to be separately doped.

As described above, the SiOx layers 131 and 161 respectively positioned on the front surface and the back surface of the semiconductor substrate 110 substantially have the same thickness T1 within the range of about 1 nm to 3 nm. The SiOx layers 131 and 161 are formed on the surface of the semiconductor substrate 110 when the $AlO_X$ layer 133 is annealed at a predetermined temperature, for example, about 450° C. to 700° C.

According to an experiment conducted by the present inventors, the SiOx layers 131 and 161 formed on the surface of the semiconductor substrate 110 when the $AlO_X$ layer 133 is annealed had an absorbance and passivation characteristics similar to a thermal oxide layer formed through a high temperature process performed at a temperature equal to or higher than about 900° C.

A reason why an annealing temperature of the $AlO_X$ layer 133 is limited to about 450° C. to 700° C. is described below with reference to FIG. 3.

Figure 3:
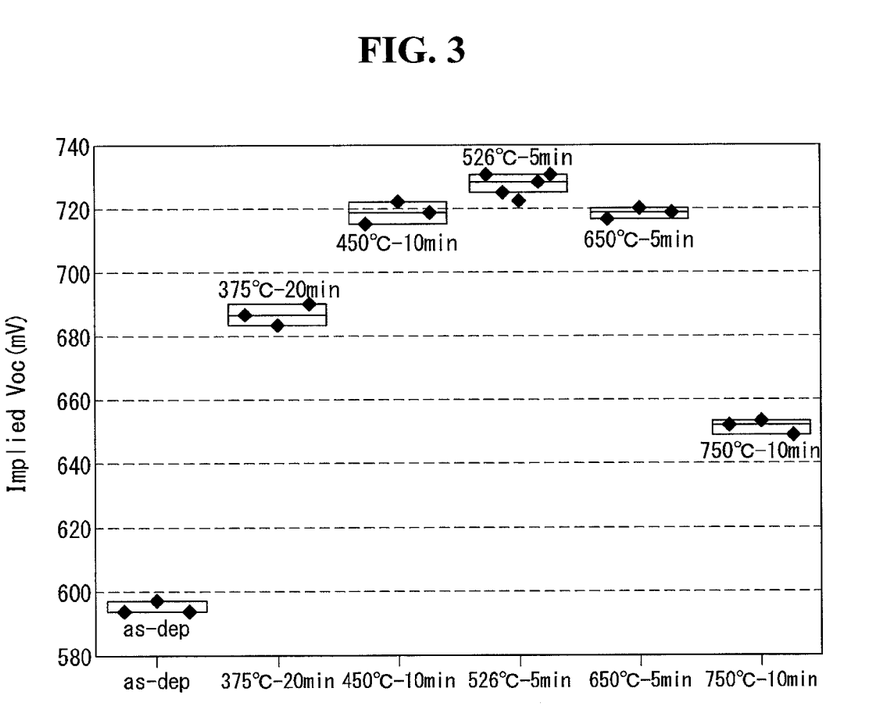
FIG. 3 is a graph showing changes in an implied open-circuit voltage (Voc) depending on a thermal processing temperature of an aluminum oxide layer.

FIG. 3 is a graph showing changes in an implied open-circuit voltage (Voc) depending on the annealing temperature of the $AlO_X$ layer.

As shown in FIG. 3, when the $AlO_X$ layer 133 was deposited (by indicated as "as -dep"), the implied Voc was equal to or less than about 600 mV. When the $AlO_X$ layer 133 was annealed at about 375° C. for about 20 minutes (by indicated as "375° C.-20 min"), the implied Voc was measured as about 690 mV.

Further, when the $AlO_X$ layer 133 was annealed at about 450° C. for about 10 minutes (by indicated as "450° C.-10 min") and at about 650° C. for about 5 minutes (by indicated as "650° C.-5 min"), the implied Voc was measured as about 720 mV. When the $AlO_X$ layer 133 was annealed at about 526° C. for about 5 minutes (by indicated as "526° C.-5 min"), the implied Voc was measured as about 730 mV. When the $AlO_X$ layer 133 was annealed at about 750° C. for about 10 minutes (by indicated as "750° C.-10 min"), the implied Voc was measured as about 650 mV.

In other words, as shown in FIG. 3, when the annealing temperature of the $AlO_X$ layer 133 was about 530° C., the implied Voc had a maximum value. When the annealing temperature of the $AlO_X$ layer 133 was equal to or higher than about 530° C., the implied Voc decreased as the annealing temperature increased. Further, when the annealing temperature of the $AlO_X$ layer 133 was equal to or lower than about 530° C., the implied Voc decreased as the annealing temperature was lowered.

Accordingly, it is preferable, but not required, that the $AlO_X$ layer 133 is annealed at a temperature, i.e., about 450° C. to 700° C. capable of obtaining the implied Voc equal to or greater than about 720 mV, so as to obtain the excellent passivation effect.

The SiNx:H layer 135 positioned on the $AlO_X$ layer 133 is formed of a material having positive fixed charges. The SiNx:H layer 135 reduces a reflectance of light incident on the solar cell through the front surface of the semiconductor substrate 110 and increases selectivity of light of a predetermined wavelength band, thereby increasing the efficiency of the solar cell.

It is preferable, but not required, that the $AlO_X$ layer 133 has a refractive index of about 1.55 to 1.7 and a thickness of about 5 nm to 30 nm, so as to minimize the light reflectance at the front surface of the semiconductor substrate 110. Further, it is preferable, but not required, that the SiNx:H layer 135 has a refractive index of about 1.9 to 2.3 and a thickness of about 50 nm to 100 nm, so as to minimize the light reflectance.

Because the SiOx layer 161 of the back passivation part 160 has the thickness T1 of about 1 nm to 3 nm, the SiOx layer 161 serves as a tunneling oxide layer.

The front electrode part 140 is positioned on the emitter region 120 of the front surface of the semiconductor substrate 110, passes through the front passivation part 130, and is electrically and physically connected to the emitter region 120.

The front electrode part 140 includes a plurality of front finger electrodes 141 extending along a first direction X-X' shown in FIG. 1 and a plurality of front bus bar electrodes 143 extending along a second direction Y-Y' perpendicular to the first direction X-X'.

The plurality of front finger electrodes 141 may be formed of at least one conductive material selected from the group consisting of nickel (Ni), copper (Cu), tin (Sn), zinc (Zn), indium (In), titanium (Ti), gold (Au), and a combination thereof. Other conductive materials may be used.

The front finger electrodes 141 may be formed using a screen printing method for printing and firing a conductive paste containing the conductive material or a plating method using a seed layer.

The plurality of front bus bar electrodes 143 are electrically and physically connected to the emitter region 120 in the same manner as the front finger electrodes 141. The front bus bar electrodes 143 are electrically and physically connected to the front finger electrodes 141.

The front bus bar electrodes 143 may be formed using the same material and method as the front finger electrodes 141.

The back surface field region 150 is locally formed at the back surface of the semiconductor substrate 110. In the embodiment of the invention, the fact that the back surface field region 150 is locally formed means that the back surface field region 150 is not formed at the entire back surface of the semiconductor substrate 110 and is formed at a portion of the back surface of the semiconductor substrate 110, for example, only at an area overlapping with the back electrode part 170 on a projected plane.

The back surface field region 150 is a region (for example, an $n^+$-type region) that is more heavily doped than the semiconductor substrate 110 with impurities of the same conductive type as the semiconductor substrate 110.

The back surface field region 150 having the above-described configuration prevents or reduces electrons and holes from being recombined and/or disappeared at and around the back surface of the semiconductor substrate 110 using a potential barrier formed by a difference between impurity concentrations of the semiconductor substrate 110 and the back surface field region 150.

The back electrode part 170 includes a plurality of back finger electrodes 171 and a plurality of back bus bar electrodes 173. The back electrode part 170 passes through the back passivation part 160 and is electrically and physically connected to the back surface field region 150.

The plurality of back finger electrodes 171 extend in the first direction X-X', and the plurality of back bus bar electrodes 173 extend in the second direction Y-Y'.

The back bus bar electrodes 173 may be positioned at a location opposite the front bus bar electrodes 143. A width of the back finger electrode 171 may be substantially equal to or different from a width of the front finger electrode 141.

The back finger electrodes 171 and the back bus bar electrodes 173 may be formed of at least one conductive material selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

The back electrode part 170 collects carriers, for example, electrons moving to the semiconductor substrate 110 and outputs the carriers to the outside.

When the back surface field region 150 and the back electrode part 170 are formed, it is preferable, but not required, that a width of the back surface field region 150 is greater than a width of the back electrode part 170, so as to secure a process margin.

When the back surface field region 150 is locally formed at the back surface of the semiconductor substrate 110, a serial resistance in a non-formation area of the back surface field region 150 may increase. Thus, it is preferable, but not required, that a distance between the back finger electrodes 171 is less than a distance between the front finger electrodes 141, so as to prevent or reduce an increase in the serial resistance at the back surface of the semiconductor substrate 110.

For example, the distance between the front finger electrodes 141 may be equal to or greater than about 2.5 mm, and the distance between the back finger electrodes 171 may be equal to or greater than about 1.0 mm and less than about 2.5 mm.

The back surface field region 150 may be locally formed at the back surface of the semiconductor substrate 110 through an ion implantation process using a mask.

When the back surface field region 150 is formed through the ion implantation process, the back surface field region 150 is not formed at an edge of the semiconductor substrate 110. Therefore, a separate process for the edge isolation is not necessary.

Because a performance of the passivation part in the non-formation area of the back surface field region 150 is improved, a recombination rate of carriers is reduced. Thus, a current density and an open circuit voltage of the solar cell increase, and the efficiency of the solar cell is improved.

The solar cell having the above-described structure according to the embodiment of the invention may be used as a bifacial solar cell, and an operation of the solar cell is described below.

When light irradiated onto the solar cell is incident on the semiconductor substrate 110 through the emitter region 120 and/or the back surface of the semiconductor substrate 110, a plurality of electron-hole pairs are generated in the semiconductor substrate 110 by light energy produced by the light incident on the semiconductor substrate 110.

In this instance, when the front surface and the back surface of the semiconductor substrate 110 are the textured surface, light reflectance in the front surface and the back surface of the semiconductor substrate 110 is reduced. Further, because both a light incident operation and a light reflection operation are performed on the textured surfaces of the semiconductor substrate 110, light is confined in the solar cell. Hence, a light absorptance and the efficiency of the solar cell are improved.

In addition, a reflection loss of light incident on the semiconductor substrate 110 is reduced by the front passivation part 130 positioned on the front surface of the semiconductor substrate 110 and the back passivation part 160 positioned on the back surface of the semiconductor substrate 110. Thus, an amount of light incident on the semiconductor substrate 110 further increases.

The electron-hole pairs are separated into electrons and holes by the p-n junction between the semiconductor substrate 110 and the emitter region 120. Then, the separated electrons move to the n-type semiconductor substrate 110, and the separated holes move to the p-type emitter region 120.

As described above, the electrons moving to the semiconductor substrate 110 move to the back electrode part 170 through the back surface field region 150, and the holes moving to the emitter region 120 move to the front electrode part 140.

Accordingly, when the front bus bar electrodes 143 of one solar cell are connected to the back bus bar electrodes 173 of another solar cell adjacent to the one solar cell using electric wires, for example, an interconnector, electric current flows therein to thereby enable use of the current for electric power.

The solar cell having the above-described configuration may be used in a state where the solar cell is positioned between a light transmission front substrate and a light transmission back substrate and is sealed by a protective layer.

A method for manufacturing the bifacial solar cell according to the first embodiment of the invention is described below.

The semiconductor substrate 110 formed of a silicon wafer is generally manufactured by slicing a silicon block or an ingot using a blade or a multi-wire saw.

The silicon wafer is provided, and then impurities of a group V element, for example, phosphorus (P) are doped on the silicon wafer. Hence, an n-type semiconductor substrate is manufactured as the semiconductor substrate 110.

When the silicon block or the ingot is sliced, a mechanical damage layer is formed in the silicon wafer.

Accordingly, a wet etching process for removing the mechanical damage layer is performed, so as to prevent a reduction in characteristics of the solar cell resulting from the mechanical damage layer of the semiconductor substrate 110. The wet etching process may use an alkaline etchant or an acid etchant.

After the mechanical damage layer is removed, the wet etching process or a dry etching process using plasma is performed to form the textured surface at both the front surface and the back surface of the semiconductor substrate 110.

When the textured surface is formed using the wet etching process, KOH may be used as the etchant.

After the textured surface is formed, the emitter region 120 is formed at the entire front surface of the semiconductor substrate 110, and the back surface field region 150 is formed at the back surface of the semiconductor substrate 110.

On the contrary, the emitter region 120 may be formed as a selective emitter structure including a heavily doped region and a lightly doped region.

The emitter region 120 and the back surface field region 150 may be formed using a general method including an impurity diffusion method, an ion implantation method, a laser irradiation method, etc. Therefore, the description of a method for forming the emitter region 120 and the back surface field region 150 may be briefly made or may be entirely omitted.

Afterwards, the $AlO_X$ layers 133 and 163 are respectively deposited on the front surface and the back surface of the semiconductor substrate 110 using an atomic layer deposition (ALD) method.

The ALD method is a nano-thin film deposition technique using a phenomenon of a monoatomic layer, which is chemically bonded in a semiconductor fabrication process. The ALD method repeatedly performs an adsorption and a substitution of molecule on the surface of the semiconductor substrate and thus can perform an ultrafine layer-by-layer deposition of a thickness of an atomic layer. The ALD method can stack oxide and a metal thin film as thin as possible. The ALD method can form a film at a temperature (for example, a temperature equal to or less than about 500° C.) lower than a chemical vapor deposition (CVD) method, which deposits particles formed by a chemical reaction of a gas on the surface of the semiconductor substrate.

The $AlO_X$ layers 133 and 163 are formed of a material having negative fixed charges. Hence, the $AlO_X$ layers 133 and 163 have the excellent chemical passivation characteristics resulting from the low interface trap density and the excellent field effect passivation characteristics resulting from the negative fixed charges. Further, the $AlO_X$ layers 133 and 163 are very excellent in the characteristics of stability, moisture transmission, and abrasion resistance.

Thus, the $AlO_X$ layers 133 and 163 reduce the recombination velocity of carries at the surface of the semiconductor substrate 110, thereby improving the efficiency and the long-term reliability of the solar cell.

Because the $AlO_X$ layer 133 serves as the front surface field region, n-type impurities for forming the front surface field region do not need to be separately doped in the solar cell including the n-type semiconductor substrate 110.

After the $AlO_X$ layers 133 and 163 are respectively deposited on the front surface and the back surface of the semiconductor substrate 110, the $AlO_X$ layers 133 and 163 are annealed at a temperature of about 100° C. to 700° C., preferably, about 450° C. to 700° C.

Since a reason to limit an annealing temperature of the $AlO_X$ layers 133 and 163 to about 450° C. to 700° C. was described above with reference to FIG. 3, a detailed description thereof may be briefly made or may be entirely omitted.

When the $AlO_X$ layers 133 and 163 are annealed at about 450° C. to 700° C. for about 5 minutes to 10 minutes, a silicon oxide layer having a thickness T1 of about 1 nm to 3 nm is formed at an interface between the $AlO_X$ layer and the semiconductor substrate 110.

In other words, the SiOx layer 131 is formed at an interface between the front surface of the semiconductor substrate 110 and the $AlO_X$ layer 133, and the SiOx layer 161 is formed at an interface between the back surface of the semiconductor substrate 110 and the $AlO_X$ layer 163. Accordingly, the SiOx layer 131 may directly contact the front surface of the semiconductor substrate 110, and the SiOx layer 161 may directly contact the back surface of the semiconductor substrate 110.

The SiOx layers 131 and 161 formed by annealing the $AlO_X$ layers 133 and 163 at about 450° C. to 700° C. have a thickness T1 equal to or less than about 3 nm. Therefore, the SiOx layers 131 and 161 may minimize the interface trap density by a chemical passivation effect and may serve as a tunneling oxide layer.

As described above, the SiOx layers 131 and 161 formed by annealing the $AlO_X$ layers 133 and 163 have passivation characteristic equal or similar to the thermal oxide layer formed through the high temperature process equal to or higher than about 900° C.

After the SiOx layers 131 and 161 are formed, the SiNx:H layer 135 is formed on the $AlO_X$ layer 133 positioned at the front surface of the semiconductor substrate 110.

The SiNx:H layer 135 may be formed using a plasma enhanced CVD (PECVD) method and serves as an anti-reflection layer. Further, the SiNx:H layer 135 serves as a mask, which prevents the $AlO_X$ layer 133 from being removed in an etching process for removing the $AlO_X$ layer 163 positioned at the back surface of the semiconductor substrate 110.

The $AlO_X$ layer 163 positioned at the back surface of the semiconductor substrate 110 may be removed through a wet etching process using an etchant.

Hydrogen chloride (HCl) may be used as the etchant for removing the $AlO_X$ layer 163.

HCl reacts with the $AlO_X$ layer 163 according to the following reaction formula to remove the $AlO_X$ layer 163.

<Reaction Formula>

$$Al_2O_3 + 6HCl \rightarrow 2AlCl_3 + 3H_2O$$

When the semiconductor substrate 110, on which the $AlO_X$ layers 133 and 163 are formed, is dipped in a bath filled with HCl, the $AlO_X$ layer 133 positioned at the front surface of the semiconductor substrate 110 is protected by the SiNx:H layer 135. Therefore, only the $AlO_X$ layer 163 positioned at the back surface of the semiconductor substrate 110 reacts with HCl according to the above reaction formula.

Accordingly, after the wet etching process, the $AlO_X$ layer 133 positioned at the front surface of the semiconductor substrate 110 remains, and the $AlO_X$ layer 163 positioned at the back surface of the semiconductor substrate 110 is removed.

The embodiment of the invention described that the $AlO_X$ layer 163 positioned at the back surface of the semiconductor substrate 110 is removed through the wet etching process using HCl as the etchant. However, the $AlO_X$ layer 163 may be removed through a standard cleaning process in embodiments of the invention.

The standard cleaning process cleans the semiconductor substrate 110 at a temperature equal to or lower than about 70° C. for about 5 minutes to 10 minutes using a cleaning solution, in which de-ionized water (DI), HCl, and $H_2O_2$ are mixed in a ratio of 5:1:1.

Afterwards, the SiNx:H layer 165 is formed on a back surface of the SiOx layer 161 positioned at the back surface of the semiconductor substrate 110.

According to the above processes, the front passivation part 130 including the SiOx layer 131 having the thickness T1 of about 1 nm to 3 nm, the $AlO_X$ layer 133 positioned on the SiOx layer 131, and the SiNx:H layer 135 positioned on the $AlO_X$ layer 133 is formed on the front surface of the semiconductor substrate 110. Further, the back passivation part 160 including the SiOx layer 161 having the thickness T1 of about 1 nm to 3 nm and the SiNx:H layer 165 positioned on the back surface of the SiOx layer 161 is formed on the back surface of the semiconductor substrate 110.

Subsequently, the front electrode part 140, which passes through the front passivation part 130 and is electrically and physically connected to the emitter region 120, is formed on the front surface of the semiconductor substrate 110. Further, the back electrode part 170, which passes through the back passivation part 160 and is electrically and physically connected to the local back surface field region 150, is formed on the back surface of the semiconductor substrate 110.

A bifacial solar cell according to a second embodiment of the invention is described below with reference to FIGS. 4 and 5.

Figure 4:
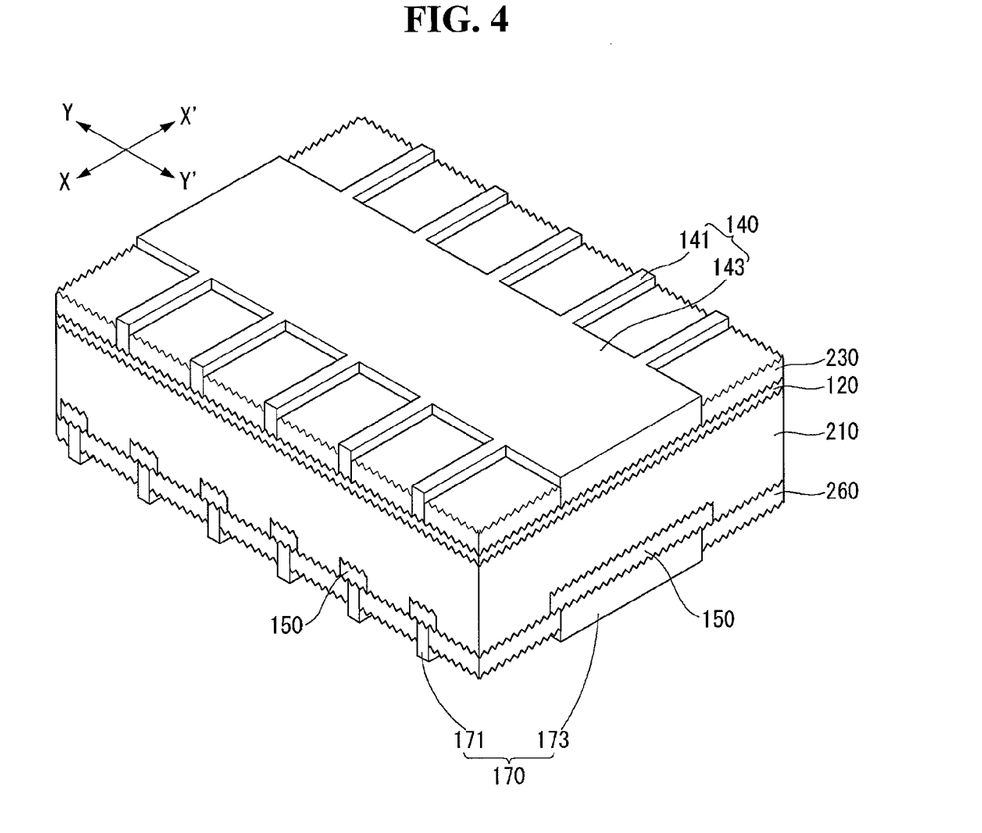
FIG. 4 is a perspective view of a main part of a solar cell according to a second embodiment of the invention.
Figure 5:
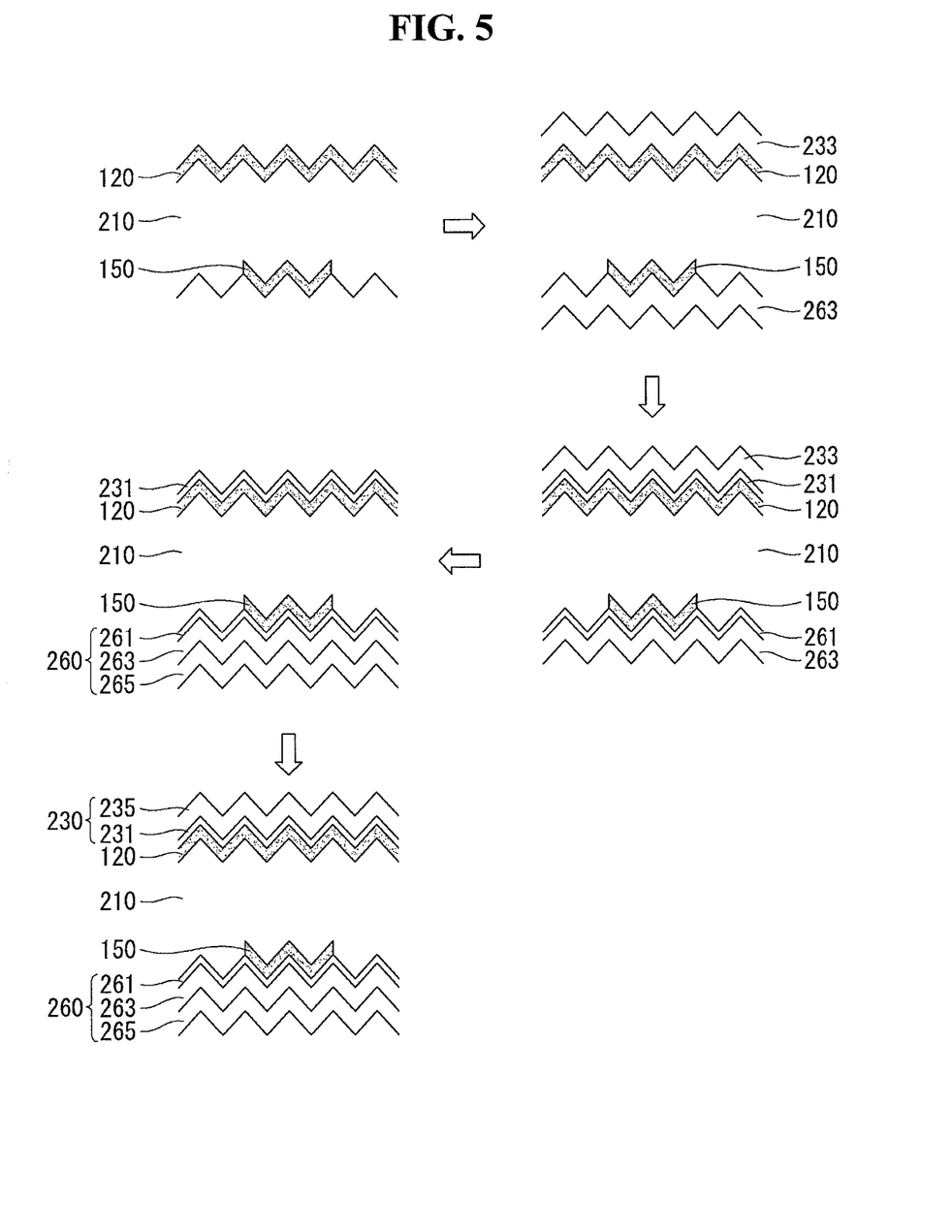
FIG. 5 is a process diagram showing a method for manufacturing the solar cell shown in FIG. 4.

FIG. 4 is a perspective view of a main part of a solar cell according to a second embodiment of the invention. FIG. 5 is a process diagram showing a method for manufacturing the solar cell shown in FIG. 4.

Since configuration of the solar cell according to the second embodiment of the invention is substantially the same as the first embodiment of the invention except a semiconductor substrate, a front passivation part, and a back passivation part, a further description may be briefly made or may be entirely omitted.

As described in the first embodiment of the invention, one of the front passivation part 130 and the back passivation part 160 includes the AlOx layer and the other does not include the AlOx layer depending on the conductive type of the semiconductor substrate 110.

In the solar cell according to the first embodiment of the invention including the n-type semiconductor substrate 110, the $AlO_X$ layer 133 is formed only on the front surface of the semiconductor substrate 110. On the other hand, in the solar cell according to the second embodiment of the invention including a p-type semiconductor substrate 210, an $AlO_X$ layer 263 is formed only on a back surface of the semiconductor substrate 210.

More specifically, in the solar cell according to the second embodiment of the invention including the p-type semiconductor substrate 210, a front passivation part 230 formed on a front surface of the semiconductor substrate 210 includes a SiOx layer 231 having a thickness T1 of about 1 nm to 3 nm and a SiNx:H layer 235 positioned on the SiOx layer 231. Further, a back passivation part 260 formed on the back surface of the semiconductor substrate 210 includes a SiOx layer 261 having a thickness T1 of about 1 nm to 3 nm, the $AlO_X$ layer 263 positioned on a back surface of the SiOx layer 261, and a SiNx:H layer 265 positioned on a back surface of the $AlO_X$ layer 263. Namely, the front passivation part 230 does not include the $AlO_X$ layer, unlike the first embodiment of the invention.

The processes performed up until annealing the $AlO_X$ layers 233 and 263 formed on the front surface and the back surface of the p-type semiconductor substrate 210 using an atomic layer deposition (ALD) method to form the SiOx layers 231 and 261 in the second embodiment of the invention are the same as the first embodiment of the invention.

After forming the SiOx layers 231 and 261, the SiNx:H layer 265 is formed on the back surface of the $AlO_X$ layer 263 positioned on the back surface of the semiconductor substrate 210.

The SiNx:H layer 265 may be formed using a plasma enhanced CVD (PECVD) method. The SiNx:H layer 265 serves as a mask, which prevents the $AlO_X$ layer 263 from being removed in an etching process for removing the $AlO_X$ layer 233 positioned at the front surface of the semiconductor substrate 210.

A wet etching process or a standard cleaning process may be used to remove the $AlO_X$ layer 233.

After removing the $AlO_X$ layer 233 formed on the front surface of the semiconductor substrate 210, the SiNx:H layer 235 is formed on the entire front surface of the SiOx layer 231. The SiNx:H layer 235 may be formed using the PECVD method.

According to the above processes, the front passivation part 230 including the SiOx layer 231 having the thickness T1 of about 1 nm to 3 nm and the SiNx:H layer 235 positioned on the SiOx layer 231 is formed on the front surface of the p-type semiconductor substrate 210. Further, the back passivation part 260 including the SiOx layer 261 having the thickness T1 of about 1 nm to 3 nm, the $AlO_X$ layer 263 positioned on the back surface of the SiOx layer 261, and the SiNx:H layer 265 positioned on the back surface of the $AlO_X$ layer 263 is formed on the back surface of the p-type semiconductor substrate 210.

Subsequently, a front electrode part 140, which passes through the front passivation part 230 and is electrically and physically connected to an emitter region 120, is formed on the front surface of the semiconductor substrate 210 using a general electrode forming method (or a commonly known electrode forming method). Further, a back electrode part 170, which passes through the back passivation part 260 and is electrically and physically connected to a local back surface field region 150, is formed on the back surface of the semiconductor substrate 210 using the general electrode forming method.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a solar cell, the method comprising:

respectively forming a front aluminum oxide (AlOx) layer and a back aluminum oxide (AlOx) layer on a front surface and a back surface of a semiconductor substrate simultaneously by an atomic layer deposition (ALD) method;

annealing the front and back aluminum oxide layers on the front surface and the back surface of the semiconductor substrate at a temperature of about 450° C. to 700° C. to form a front silicon oxide (SiOx) layer having a thickness of about 1 nm to 3 nm between the front aluminum oxide layer and the front surface of the semiconductor substrate and a back silicon oxide (SiOx) layer having a thickness of about 1 nm to 3 nm between the back aluminum oxide layer and the back surface of the semiconductor substrate; and removing one of the front aluminum oxide layer and the back aluminum oxide layer depending on a conductive type of the semiconductor substrate after the step of annealing the front and back aluminum oxide layers, thereby leaving the front silicon oxide layer and the back silicon oxide layer regardless of the conductive type of the semiconductor substrate, and thereby leaving only one of the front aluminum oxide layer or the back aluminum oxide layer depending on the conductive type of the semiconductor substrate.

2. The method for manufacturing a solar cell of claim 1, further comprising:

forming a hydrogenated silicon nitride (SiNx:H) layer on a front surface of the front aluminum oxide layer or a back surface of the back aluminum oxide layer.

3. The method for manufacturing a solar cell of claim 2, wherein the hydrogenated silicon nitride (SiNx:H) layer is on the front aluminum oxide layer and is used as a mask during the removing of the back aluminum oxide layer.

4. The method for manufacturing a solar cell of claim 2, wherein the hydrogenated silicon nitride (SiNx:H) layer is on the back aluminum oxide layer and is used as a mask during the removing of the front aluminum oxide layer.

5. The method for manufacturing a solar cell of claim 1, further comprising:

forming an emitter region between the front surface of the semiconductor substrate and the front silicon oxide layer on the front surface of the semiconductor substrate.

6. The method for manufacturing a solar cell of claim 5, further comprising:
forming a front electrode part, which is electrically connected to the emitter region, on the front surface of the semiconductor substrate.

7. The method for manufacturing a solar cell of claim 1, further comprising:
forming a back surface field region between the back surface of the semiconductor substrate and the back silicon oxide layer on the back surface of the semiconductor substrate.

8. The method for manufacturing a solar cell of claim 7, further comprising:
faulting a back electrode part, which is electrically connected to the back surface field region, on the back surface of the semiconductor substrate.

9. The method for manufacturing a solar cell of claim 1, wherein the front aluminum oxide layer is used as a front surface field region.

10. The method for manufacturing a solar cell of claim 1, wherein the step of removing is performed by a wet etching process or a cleaning process.

11. The method for manufacturing a solar cell of claim 10, wherein the wet etching process is performed by a Hydrogen chloride (HCl) etchant.

12. The method for manufacturing a solar cell of claim 10, wherein the cleaning process is performed by de-ionized water (DI).

13. The method for manufacturing a solar cell of claim 1, wherein when the first conductive type of the semiconductor substrate is an n-type, the back aluminum oxide layer on the back surface of the semiconductor substrate is removed.

14. The method for manufacturing a solar cell of claim 1, wherein when the first conductive type of the semiconductor substrate is a p-type, the front aluminum oxide layer on the front surface of the semiconductor substrate is removed.

15. The method for manufacturing a solar cell of claim 1, wherein the thickness of the front silicon oxide layer is the same as the thickness of the back silicon oxide layer.

* * * * *